United States Patent
Langhammer

(10) Patent No.: US 8,482,312 B1
(45) Date of Patent: Jul. 9, 2013

(54) LOGIC STRUCTURES FOR TERNARY ADDITION IN LOGIC DEVICES

(75) Inventor: Martin Langhammer, Alderbury (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/152,441

(22) Filed: Jun. 3, 2011

(51) Int. Cl.
*H03K 19/173* (2006.01)

(52) U.S. Cl.
USPC ............... 326/38; 326/41; 708/235; 708/709

(58) Field of Classification Search
USPC ............................................. 326/37–41, 47
See application file for complete search history.

(56) References Cited

U.S. PATENT DOCUMENTS

| | | | |
|---|---|---|---|
| 5,524,088 A * | 6/1996 | Yoshida | 708/493 |
| 7,274,211 B1 | 9/2007 | Simkins et al. | |
| 7,565,388 B1 | 7/2009 | Baeckler et al. | |
| 7,619,443 B1 * | 11/2009 | Vanderhoek et al. | 326/41 |
| 7,911,230 B1 * | 3/2011 | Schleicher et al. | 326/41 |
| 2009/0216826 A1 * | 8/2009 | Brisk et al. | 708/670 |
| 2011/0238718 A1 * | 9/2011 | Langhammer | 708/235 |

* cited by examiner

*Primary Examiner* — Jany Richardson
(74) *Attorney, Agent, or Firm* — Ropes & Gray LLP; Jeffrey H. Ingerman

(57) ABSTRACT

A logic circuit has a first logic element ("LE") including a first lookup table ("LUT"), where the first LUT is operable to produce a carry from a first set of bits of at least two numbers. The logic circuit also has a second LE including a second LUT, where the second LUT is operable to produce a sum from a second set of bits of the at least two numbers. The second LE also includes an adder coupled directly to the first LUT and coupled to the second LUT, where the adder is operable to add the carry and the sum. The at least two numbers may be three numbers, but the logic circuit includes a set of connections operable to programmably interconnect selected inputs so that the logic circuit is operable to add only two numbers. The logic circuit may be incorporated in a programmable logic device.

16 Claims, 6 Drawing Sheets

US 8,482,312 B1

LOGIC STRUCTURES FOR TERNARY ADDITION IN LOGIC DEVICES

FIELD OF THE INVENTION

This invention relates to logic structures for efficient implementation of logic functions and arithmetic functions, including ternary addition, in integrated circuit devices, and particularly in programmable logic devices (PLDs) such as field-programmable gate arrays (FPGAs).

BACKGROUND OF THE INVENTION

Many integrated circuit devices support both logical and arithmetic operations. In some forms of integrated circuit devices, particularly PLDs such as FPGAs, logic is provided that can be configured for different kinds of operations. Commonly-assigned U.S. Pat. No. 7,565,388, which is hereby incorporated by reference herein in its entirety, describes a programmable device having logic blocks including lookup-table based logic elements that can be configured to perform logical and arithmetic operations. In arithmetic mode, those logic elements could be configured to perform binary addition, among other functions, or, by selecting, as an input to a dedicated adder in one logic element, a signal from another logic element, to perform ternary addition.

SUMMARY OF THE INVENTION

The present invention relates to a logic block structure in an integrated circuit device that can be used to perform binary or ternary addition, as well as other arithmetic and logical functions. Each logic module in the logic block includes a plurality of lookup tables and a plurality of dedicated adders. At least one of the dedicated adders has a dedicated input from another logic module in the logic block to facilitate ternary arithmetic operations, such as ternary addition. In order to maintain the ability to perform the desired logical operations, as well as binary arithmetic operations, each logic module has additional inputs as compared to a logic element of the above-incorporated U.S. Pat. No. 7,565,388, but the routing and interconnect structures of the logic block are arranged so that the connectivity, and therefore the functionality, of such a logic element can be replicated.

Therefore, in accordance with the present invention, there is provided a logic circuit having a first logic element ("LE") including a first lookup table ("LUT"), where the first LUT is operable to produce a carry from a first set of bits of at least two numbers. The logic circuit also has a second LE including a second LUT, where the second LUT is operable to produce a sum from a second set of bits of the at least two numbers. The second LE also includes an adder coupled directly to the first LUT and coupled to the second LUT, where the adder is operable to add the carry and the sum.

There is also provided a logic block for a programmable integrated circuit device. The logic block includes a plurality of logic modules, each of the logic modules comprising a plurality of logic elements. The logic block has a plurality of local conductors serving the plurality of logic modules. Each respective one of the logic modules has a respective plurality of inputs intersecting the plurality of local conductors. The logic block further includes a respective less-than-fully populated matrix of interconnections where each of the respective pluralities of inputs intersects the plurality of local conductors, and at least a subset each of the less-than-fully populated matrices of interconnections is identical to at least a subset of each other of the less-than-fully populated matrices of interconnections for at least a subset of the plurality of logic modules, each of the subsets including connections to more than one of the local conductors. Corresponding inputs of respective logic elements in each logic module in that subset of the plurality of logic modules are programmably connectable to respective identical subsets of the vertical local conductors.

Programmable logic devices incorporating the logic circuit or the logic block are also provided.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Figure 1:
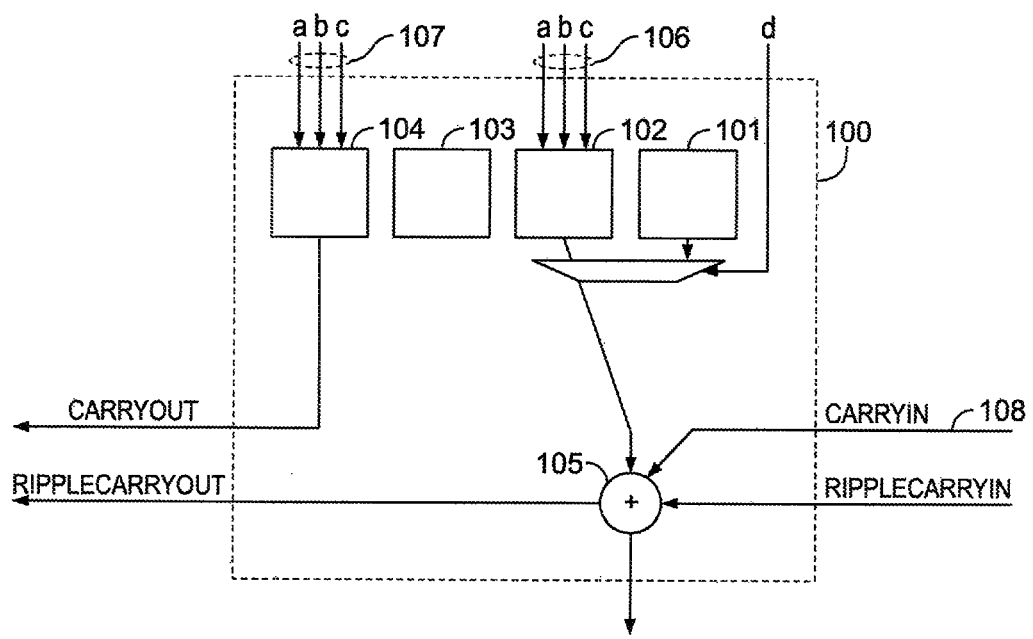
FIG. 1 shows in conceptual form one embodiment of a ternary adder.

A form of ternary adder 100 is shown conceptually in FIG. 1. Ternary adder 100 is implemented using lookup tables 101, 102, 103, 104 as a 3:2 compressor, the two outputs of which are a sum bit and a carry bit. The sum and carry vectors are added by carry-propagate adder 105. The sum bit is an exclusive-OR of the three ternary inputs 106, and the carry bit is a majority decode 104 (i.e., the carry bit is '0' if there are fewer than two '1' bits in the three input bits) of the corresponding three bits 107 input to an adjacent logic element and carried or cascaded in at 108.

Figure 2:
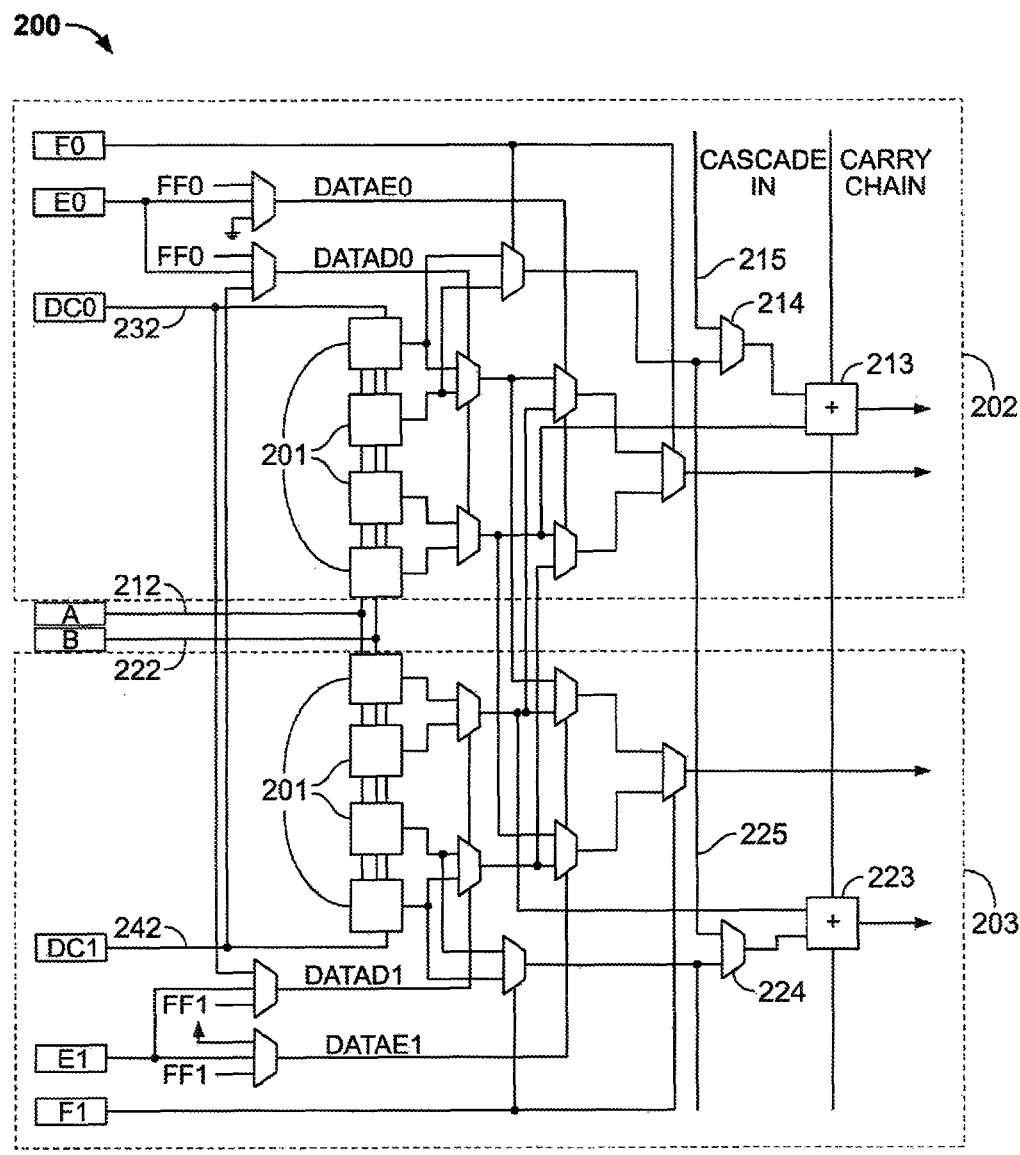
FIG. 2 shows a logic element or module that can implement the structure of FIG. 1.

In above-incorporated U.S. Pat. No. 7,565,388, ternary adder 100 is implemented in a logic module structure 200 such as that shown in FIG. 2. Logic module 200 includes eight lookup tables 201, configured in groups of four as two "adaptive lookup tables" 202, 203. Two inputs A, B (212, 222) are shared by all lookup tables 201, while another input DC0 (232) is shared only by the lookup tables 201 in adaptive lookup table 202 and another input DC1 (242) is shared only by the lookup tables 201 in adaptive lookup table 203. If lookup tables 201 are three-input lookup tables, then adaptive lookup tables 202, 203 are five-input lookup tables.

Logic module 200 also includes two carry-propagate adders 213, 223, which are associated, respectively, with the respective adaptive lookup tables 202, 203. To facilitate ternary addition, each of adders 213, 223 has on one of its inputs an associated input multiplexer 214, 224, which allows the selection of a carry or cascade input from a different logic module (at 215) or from a different adaptive lookup table (at 225).

Figure 3:
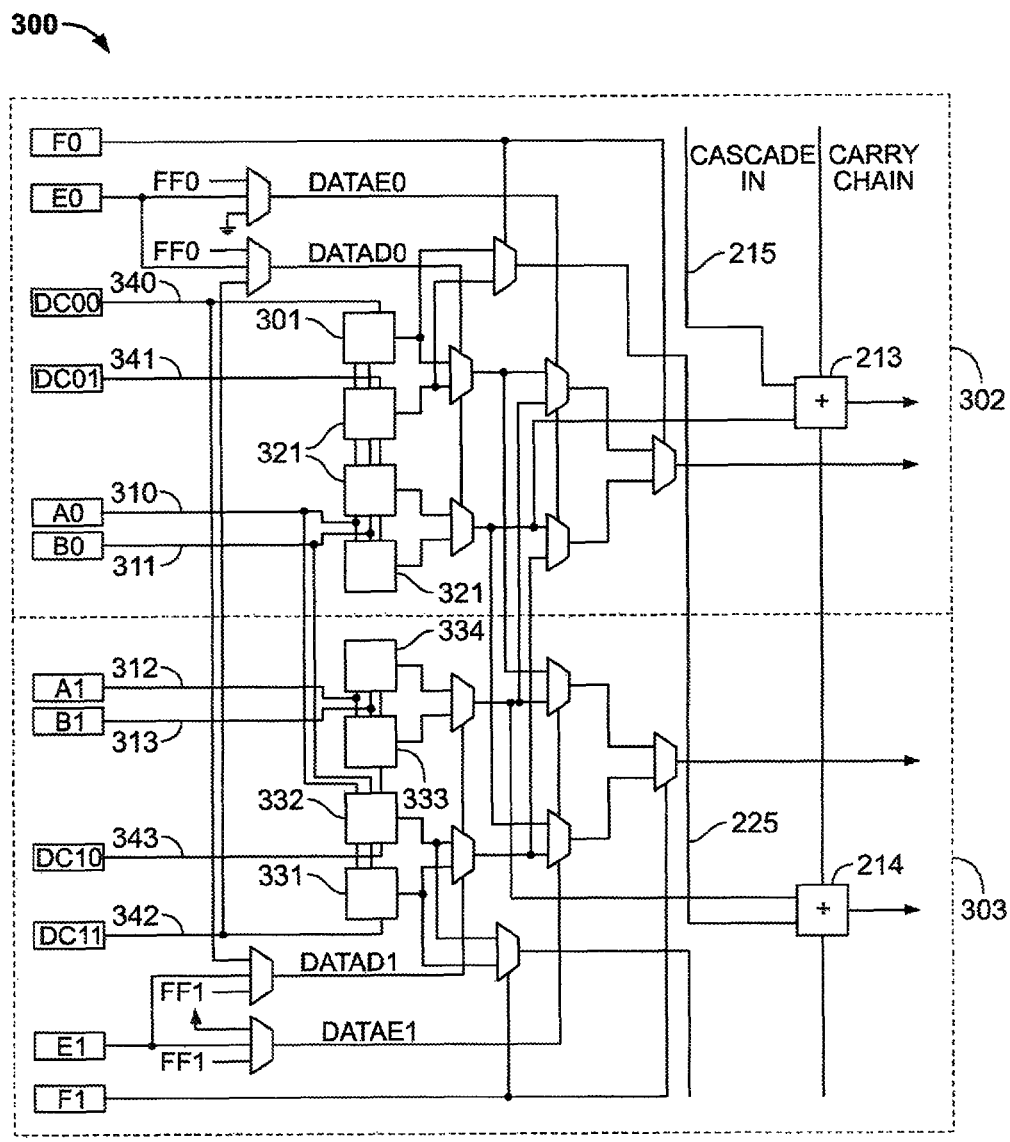
FIG. 3 shows, in structural form similar to FIG. 2, a logic module structure incorporating an embodiment of the invention.

FIG. 3 shows a logic module 300 according to an embodiment of the present invention. Device area is saved by eliminating multiplexers 214, 224. To preserve the ability to perform ternary addition, the carry or cascade inputs 215, 225 selectable by multiplexers 214, 224 in logic module 200 are made permanent in logic module 300. In addition, the number of inputs to logic module 300 is increased as compared to logic module 200. For example, instead of inputs A, B (212, 222), logic module 300 has inputs A0, B0 (310, 311) shared by all four lookup tables 301, 321 in adaptive lookup table 302 as well as by lookup tables 331, 332 in adaptive lookup table 303, and inputs A1, B1 (312, 313) shared by lookup tables 333, 334 in adaptive lookup table 303.

Similarly, instead of input DC0 (232) shared by the lookup tables 201 in adaptive lookup table 202, input DC00 (340) serves only lookup table 301 in adaptive lookup table 302 and input DC01 (341) serves lookup tables 321 in adaptive lookup table 302. And input DC11 (342) serves only lookup table 331 in adaptive lookup table 302 while input DC10 (343) serves lookup tables 332, 333, 334 in adaptive lookup table 302.

To preserve the functionality of logic module 200 in logic module 300, it would be necessary to be able to supply the same signal to input A0 (310) and to input A1 (312), the same signal to input B0 (311) and to input B1 (313), the same signal to input DC00 (340) and to input DC01 (341), and the same signal to input DC10 (343) and to input DC11 (342). However, such logic modules are typically part of a logic block, having block-wide "local" routing, and it is desirable, to conserve die area, to avoid increasing the amount of local routing conductors within such a logic block. Such a logic block structure 400, incorporating logic modules 300 according to an embodiment of the invention, is shown in part in FIG. 4.

Figure 4:
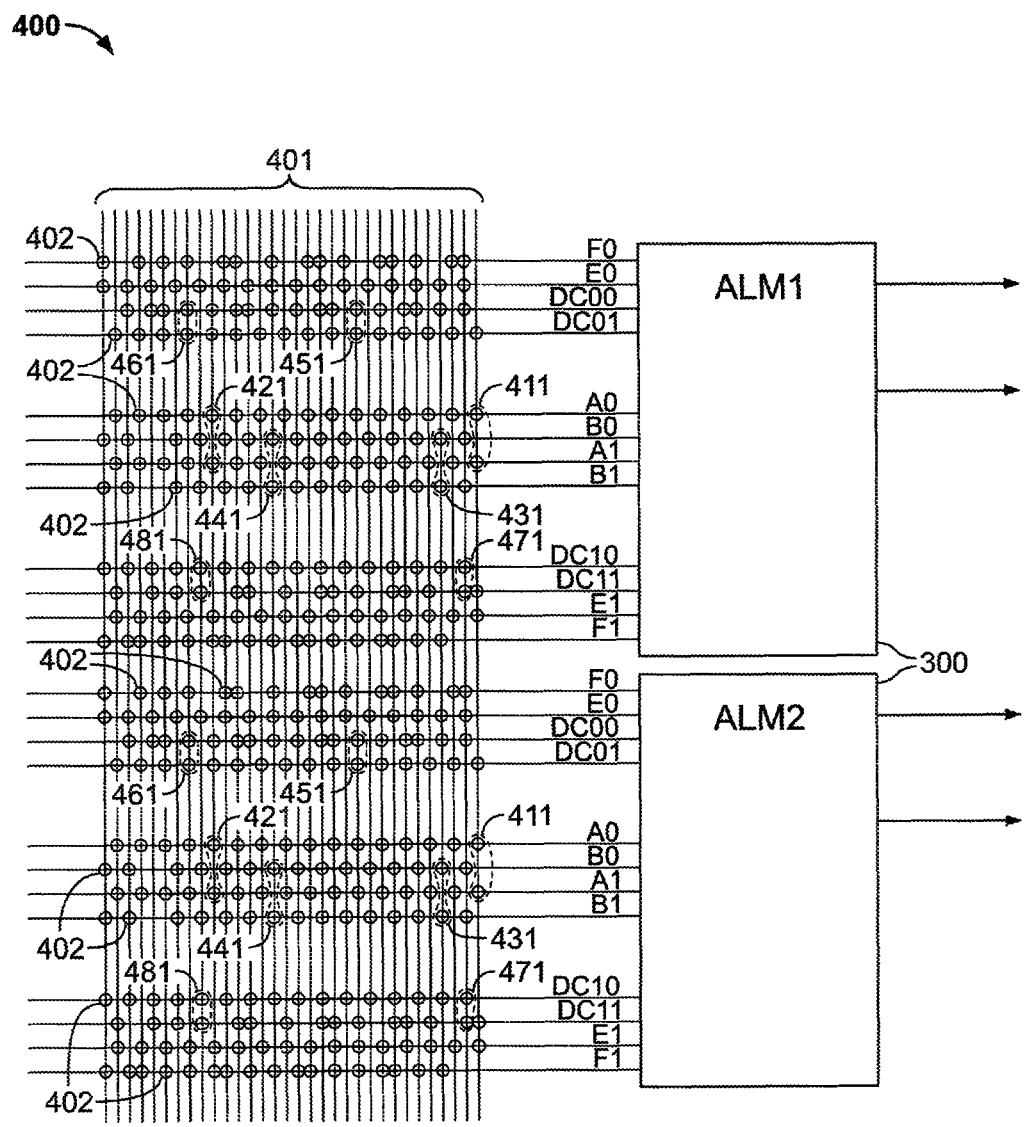
FIG. 4 shows a logic block structure according to an embodiment of the invention, incorporating logic modules as in FIG. 3.

Although logic block 400 would typically have a larger number—e.g., ten—logic modules 300, only two logic modules 300 are shown in FIG. 4. In an embodiment available in the STRATIX® family of devices from Altera Corporation, of San Jose, Calif., there would typically be fifty-two local conductors 401, but only thirty-two vertical "local" conductors 401 of block 400 are shown, to avoid cluttering FIG. 4.

As is common in programmable devices, the matrices of connections between vertical conductors 401 and the various horizontal inputs to the logic modules 300 are not fully populated—i.e., not every vertical wire can be connected to every horizontal input. However, enough connections typically are provided that the vast majority of user logic designs can be fit to the device.

The circles 402 at the intersections between vertical conductors 401 and the various horizontal inputs to the logic modules 300 indicate available programmable connections. In accordance with embodiments of the present invention, those connections are arranged so that the logic module in the above-incorporated patent can be replicated. Indeed, the connections are arranged so that the logic module in the above-incorporated patent can be replicated more than once so that the carry or cascade referred to above can be accomplished.

Specifically, the A0 and A1 inputs are connectable to the same vertical conductor at least at 411 and 421, and the B0 and B1 inputs are connectable to the same vertical conductor at least at 431 and 441, to allow replication of the A and B inputs of the above-incorporated patent in two different logic modules. Similarly, the DC00 and DC01 inputs are connectable to the same vertical conductor at least at 451 and 461, and the DC10 and DC11 inputs are connectable to the same vertical conductor at least at 471 and 481, to allow replication of the DC0 and DC1 inputs of the above-incorporated patent in two different logic modules.

To generalize, at least a respective subset of each of the matrices of available programmable connections between the vertical local conductors of the logic block and the inputs of each logic module preferably are identical for at least a plurality of logic modules in the block. In some embodiments, that may be true for all logic modules in the block, and in some embodiments, the complete matrices may be identical. Within each of those matrices of available programmable connections, where a logic module includes a plurality of adaptive lookup tables, each of which in turn includes a plurality of individual lookup tables, to the extent that corresponding inputs of respective individual lookup tables are served by separate inputs to the logic module, each of those separate inputs may be programmably connectable to the same respective subset of vertical local conductors. Such a logic block can form the basis of a programmable device that uses a ternary adder structure as its basic functional unit, while the additional interconnectivity of the inputs allows such a programmable device to support logic functions based on binary adder architectures.

Figure 5:
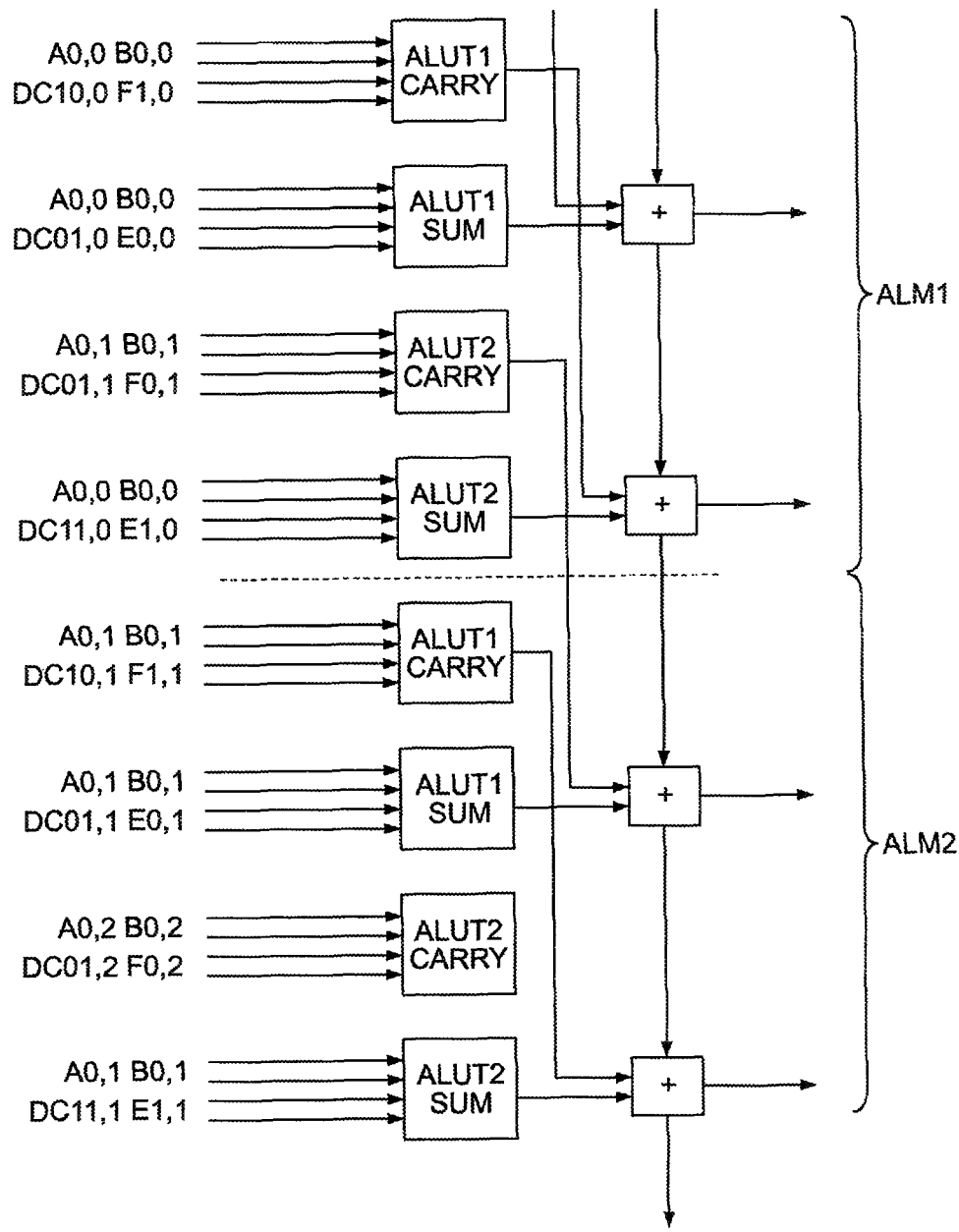
FIG. 5 is a schematic view of the logic block structure of FIG. 4 configured for binary arithmetic.

Returning to the example of a programmable logic block that can perform both binary and ternary arithmetic operations, as well as other operations, Table 1 below shows which inputs in FIG. 4 would have to be connected to which portions of which logic modules. Specifically, where there are two adaptive logic modules ALM1 and ALM2, each having two adaptive lookup tables ALUT1 and ALUT2, with each adaptive lookup table computing both a Carry vector and a Sum vector, Table 1 shows, both for the default mode (logic operations and ternary arithmetic operations) and the binary arithmetic mode (binary arithmetic operations), which inputs are connected to the respective Carry and Sum portions of ALUT1 and ALUT2 in ALM1, and ALUT1 and ALUT2 in ALM2. The logical result of implementing Table 1 in binary arithmetic mode is shown in FIG. 5.

TABLE 1

| | Default Mode (Logic and Ternary Arithmetic) | Binary Arithmetic Mode |
|---|---|---|
| ALM1, ALUT1, Carry | A0,0<br>B0,0<br>DC00,0<br>F0,0 | A0,0<br>B0,0<br>DC10,0<br>F1,0 |
| ALM1, ALUT1, Sum | A0,0<br>B0,0<br>DC01,0<br>E0,0 | A0,0<br>B0,0<br>DC01,0<br>E0,0 |
| ALM1, ALUT2, Carry | A0,0<br>B0,0<br>DC10,0<br>F1,0 | A0,1<br>B0,1<br>DC01,1<br>F0,1 |
| ALM1, ALUT2, Sum | A0,0<br>B0,0<br>DC11,0<br>E1,0 | A0,0<br>B0,0<br>DC11,0<br>E1,0 |
| ALM2, ALUT1, Carry | A0,1<br>B0,1<br>DC00,1<br>F0,1 | A0,1<br>B0,1<br>DC10,1<br>F1,1 |
| ALM2, ALUT1, Sum | A0,1<br>B0,1<br>DC01,1<br>E0,1 | A0,1<br>B0,1<br>DC01,1<br>E0,1 |
| ALM2, ALUT2, Carry | A0,1<br>B0,1<br>DC10,1<br>F1,1 | A0,2<br>B0,2<br>DC01,2<br>F0,2 |
| ALM2, ALUT2, Sum | A0,1<br>B0,1<br>DC11,1<br>E1,1 | A0,1<br>B0,1<br>DC11,1<br>E1,1 |

In the foregoing Table, each entry indicates a signal and which ALM it comes from, with ALM1 indicated by "0" and ALM2 indicated by "1". In addition, for the ALM2, ALUT2, Carry, a "2" indicates a signal from ALM3 (not shown). Thus, for example, "B0,0" indicates the B0 signal from ALM1, while "E1,1" indicates the E1 signal from ALM2. In addition, where inputs for the binary arithmetic mode differ from inputs for the default mode, the inputs for the binary arithmetic mode are shown in bold type. It may be noted that only the lookup tables that generate the carry bits have alternate inputs in this embodiment.

As can be seen, in the "Binary Arithmetic Mode," some inputs come from the next ALUT or ALM. However, the overall number of independent connections is not increased, as the sources of those inputs are also routed to the next ALUT or ALM.

It should also be recognized that binary arithmetic operations, such as, e.g., binary addition, may be performed in the ternary mode by setting one of the inputs to '0'. This can be accomplished by routing a '0' input vector to one input to the lookup table, or alternatively by configuring the lookup table to ignore one input.

Programmable devices incorporating the present invention can be compatible in binary mode with devices such as those in the above-incorporated U.S. Pat. No. 7,565,388. This provides compatibility with existing preprogrammed logical functions and user logic designs.

The embodiments shown above are merely exemplary. These and other configurations in accordance with the invention can be implemented in programmable integrated circuit devices such as programmable logic devices, where programming software can be provided to allow users to configure a programmable device to perform the various operations.

Figure 6:
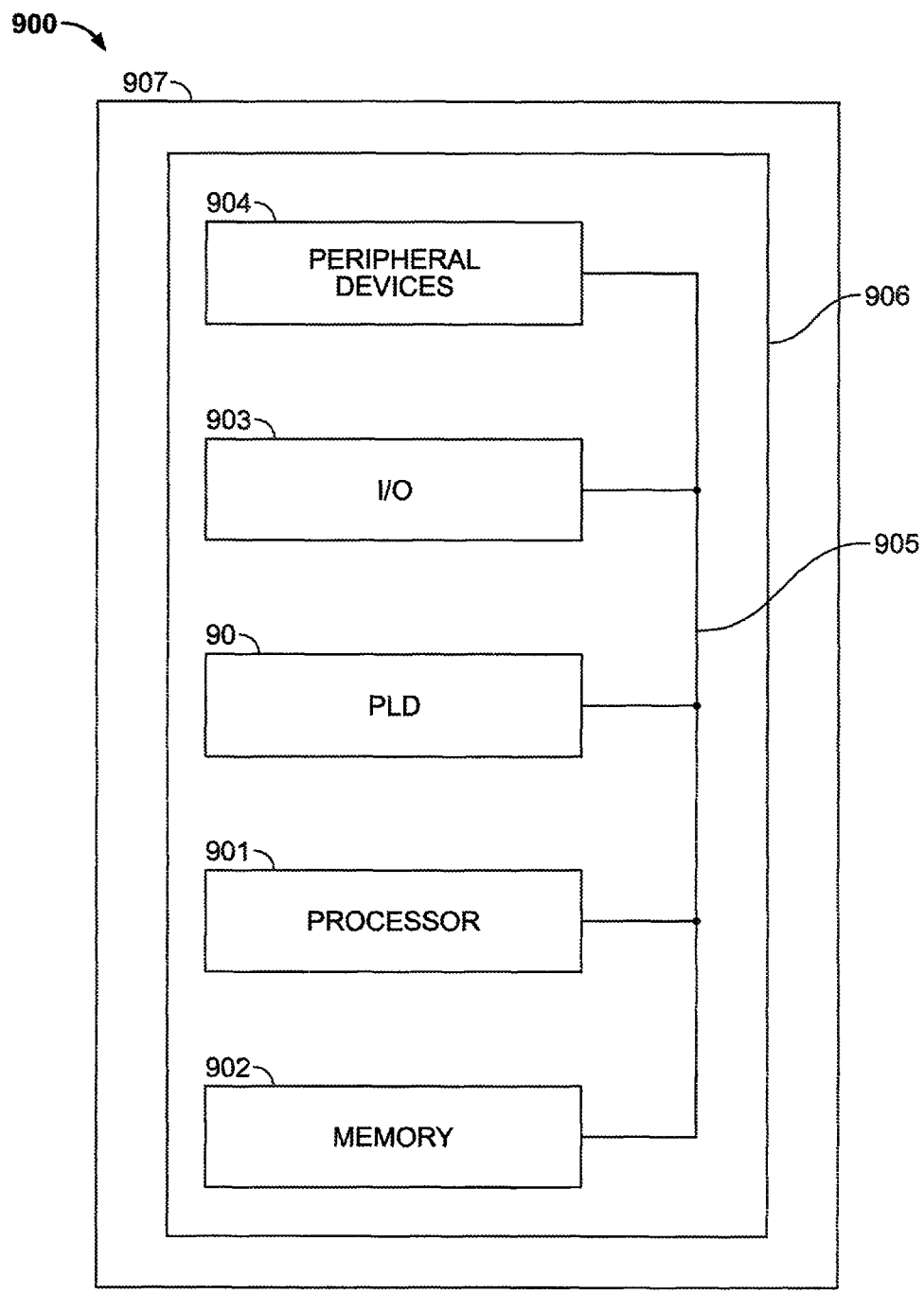
FIG. 6 is a simplified block diagram of an illustrative system employing a programmable logic device incorporating the present invention.

A PLD 90 incorporating a logic block according to the present invention may be used in many kinds of electronic devices. One possible use is in a data processing system 900 shown in FIG. 6. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to a shared resources in system 900. In yet another example, PLD 90 can be configured as an interface between processor 901 and one of the other components in system 900. It should be noted that system 900 is only exemplary, and that the true scope and spirit of the invention should be indicated by the following claims.

Various technologies can be used to implement PLDs 90 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A logic circuit comprising:
a first logic element ("LE") including a first lookup table ("LUT"), wherein said first LUT is operable to produce a carry from a first set of bits of three numbers; and
a second LE including:
a second LUT, wherein said second LUT is operable to produce a sum from a second set of bits of said three numbers, and
an adder coupled to receive output of said first LUT directly from said first LE, and coupled to said second LUT, wherein said adder is operable to add said carry and said sum; wherein:
said first LE has a first plurality of inputs for bits of said three numbers;
said second LE has a second plurality of inputs for other bits of said three numbers; and
said logic circuit further comprises a set of connections operable to programmably interconnect selected inputs in said first plurality of inputs to selected inputs in said second plurality of inputs, whereby when said set of connections is programmed to interconnect said selected inputs in said first plurality of inputs to said selected inputs in said second plurality of inputs, said logic circuit is operable to add only two numbers.

2. The logic circuit of claim 1 wherein:
said first LUT comprises a first plurality of smaller LUTs;
said second LUT comprises a second plurality of smaller LUTs;
said first plurality of inputs conduct respective bits of said three numbers to respective ones of said smaller LUTs in said first plurality of smaller LUTs; and
said second plurality of inputs conduct respective other bits of said three numbers to respective ones of said smaller LUTs in said second plurality of smaller LUTs.

3. A programmable integrated circuit device comprising:
at least one logic block comprising:
a first logic element ("LE") including a first lookup table ("LUT"), wherein said first LUT is operable to produce a carry from a first set of bits of three numbers; and
a second LE including:
a second LUT, wherein said second LUT is operable to produce a sum from a second set of bits of said three numbers, and
an adder coupled to receive output of said first LUT directly from said first LE, and coupled to said second LUT, wherein said adder is operable to add said carry and said sum; wherein:
said first LE has a first plurality of inputs for bits of said three numbers;
said second LE has a second plurality of inputs for other bits of said three numbers; and
said at least one logic block further comprises:
a plurality of local conductors serving at least said first LE and said second LE, and
a set of connections operable to programmably interconnect selected inputs in said first plurality of inputs to selected inputs in said second plurality of inputs via selected conductors in said plurality of local conductors, whereby when said set of connections is programmed to interconnect said selected inputs in said first plurality of inputs to said selected inputs in said second plurality of inputs, said logic circuit is operable to add only two numbers.

4. The programmable integrated circuit device of claim 3 wherein:
    said first LUT comprises a first plurality of smaller LUTs;
    said second LUT comprises a second plurality of smaller LUTs;
    said first plurality of inputs conduct respective bits of said three numbers to respective ones of said smaller LUTs in said first plurality of smaller LUTs; and
    said second plurality of inputs conduct respective other bits of said three numbers to respective ones of said smaller LUTs in said second plurality of smaller LUTs.

5. A logic block for a programmable integrated circuit device, said logic block comprising:
    a plurality of logic modules, each of said logic modules comprising a plurality of logic elements; and
    a plurality of local conductors serving said plurality of logic modules; wherein:
    each respective one of said logic modules has a respective plurality of inputs intersecting said plurality of local conductors, including a first plurality of inputs for bits of three numbers and a second plurality of inputs for other bits of said three numbers; said logic block further comprising:
    a respective less-than-fully populated matrix of interconnections where each said respective plurality of inputs intersects said plurality of local conductors, at least a subset of each said respective less-than-fully populated matrix of interconnections being identical to at least a subset of each other said respective less-than-fully populated matrix of interconnections for at least a subset of said plurality of logic modules, each of said subsets including connections to more than one of said local conductors; wherein:
    corresponding inputs of respective logic elements in each logic module in said subset of said plurality of logic modules are programmably connectable to common ones of said local conductors; and
    said logic block further comprises a set of connections operable to programmably interconnect selected inputs in said first plurality of inputs to selected inputs in said second plurality of inputs, whereby when said set of connections is programmed to interconnect said selected inputs in said first plurality of inputs to said selected inputs in said second plurality of inputs, said logic block is operable to operate on only two numbers.

6. The logic block of claim 5 wherein each of said logic elements is an adaptive lookup table comprising a plurality of individual lookup tables and a dedicated binary adder circuit associated with said plurality of individual lookup tables.

7. The logic block of claim 6 wherein:
    inputs in a first one of said respective plurality of inputs conduct respective bits of three numbers to respective ones of said individual lookup tables in a first one of said logic elements; and
    inputs in a second one of said respective plurality of inputs conduct respective bits of said three numbers to respective ones of said individual lookup tables in a second one of said logic elements.

8. The logic block of claim 6 wherein one input of said dedicated binary adder circuit in one of said logic elements is cascaded from another one of said logic elements.

9. The logic block of claim 8 wherein said another one of said logic elements is another logic element in said logic module.

10. The logic block of claim 8 wherein said another one of said logic elements is another logic element in another one of said logic modules.

11. A programmable integrated circuit device comprising:
    at least one logic block comprising:
    a plurality of logic modules, each of said logic modules comprising a plurality of logic elements; and
    a plurality of local conductors serving said plurality of logic modules; wherein:
    each respective one of said logic modules has a respective plurality of inputs intersecting said plurality of local conductors, including a first plurality of inputs for bits of three numbers and a second plurality of inputs for other bits of said three numbers; said logic block further comprising:
    a respective less-than-fully populated matrix of interconnections where each said respective plurality of inputs intersects said plurality of local conductors, each said respective less-than-fully populated matrix of interconnections being identical to each other said respective less-than-fully populated matrix of interconnections for at least a subset of said plurality of logic modules; wherein:
    corresponding inputs of respective logic elements in each logic module in said subset of said plurality of logic modules are programmably connectable to respective identical subsets of said local conductors; and
    said logic block further comprises a set of connections operable to programmably interconnect selected inputs in said first plurality of inputs to selected inputs in said second plurality of inputs, whereby when said set of connections is programmed to interconnect said selected inputs in said first plurality of inputs to said selected inputs in said second plurality of inputs, said logic block is operable to operate on only two numbers.

12. The programmable integrated circuit device of claim 11 wherein each of said logic elements is an adaptive lookup table comprising a plurality of individual lookup tables and a dedicated binary adder circuit associated with said plurality of individual lookup tables.

13. The programmable integrated circuit device of claim 12 wherein each said respective less-than-fully populated matrix of interconnections is identical to each other said respective less-than-fully populated matrix of interconnections for corresponding ones of said plurality of individual lookup tables in subset of said plurality of logic modules.

14. The programmable integrated circuit device of claim 12 wherein one input of each said associated dedicated binary adder circuit is cascaded from another one of said logic elements.

15. The programmable integrated circuit device of claim 14 wherein said another one of said logic elements is another logic element in said logic module.

16. The programmable integrated circuit device of claim 14 wherein said another one of said logic elements is another logic element in another one of said logic modules.

* * * * *